United States Patent
Cho et al.

(10) Patent No.: US 7,973,619 B2
(45) Date of Patent: Jul. 5, 2011

(54) ELECTRO-MAGNETIC BANDGAP STRUCTURE

(75) Inventors: Won-Woo Cho, Busan (KR); Dek-Gin Yang, Chungcheongbuk-do (KR); Bong-Wan Koo, Jinhae-si (KR); Hyung-Ho Kim, Incheon (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 282 days.

(21) Appl. No.: 12/437,341

(22) Filed: May 7, 2009

(65) Prior Publication Data
US 2010/0085128 A1    Apr. 8, 2010

(30) Foreign Application Priority Data
Oct. 8, 2008 (KR) .................. 10-2008-0098617

(51) Int. Cl.
*H01P 1/203* (2006.01)
*H01P 5/08* (2006.01)
(52) U.S. Cl. ......... 333/167; 333/202; 333/185; 174/262
(58) Field of Classification Search ............. 333/167, 333/168, 185, 202, 203, 204, 206, 212; 174/260, 174/262, 264; 361/816, 818
See application file for complete search history.

(56) References Cited

U.S. PATENT DOCUMENTS
7,764,149 B2 * 7/2010 Han et al. ............... 333/204

FOREIGN PATENT DOCUMENTS
KR    10-0669354    1/2007
KR    10-2008-0072505    8/2008

OTHER PUBLICATIONS
Korean Office Action, w/ partial English translation thereof, issued in Korean Patent Application No. KR 10-2008-0098617 dated Jun. 28, 2010.

* cited by examiner

*Primary Examiner* — Stephen E Jones
(74) *Attorney, Agent, or Firm* — McDermott Will & Emery LLP

(57) ABSTRACT

An electro-magnetic bandgap structure is disclosed. The electro-magnetic bandgap structure in accordance with an embodiment of the present invention includes a plurality of conductive plates bridge-connected with one another on a same plane, whereas the each of the conductive plates includes an internal patch; a first ring patch be electrically separated from the internal patch and surrounding the internal patch; and a second ring patch surrounding the first ring patch and electrically connected with the first ring patch through a portion.

10 Claims, 5 Drawing Sheets

ELECTRO-MAGNETIC BANDGAP STRUCTURE

CROSS-REFERENCE TO RELATED APPLICATIONS

This application claims the benefit of Korean Patent Application No. 10-2008-0098617, filed with the Korean Intellectual Property Office on Oct. 8, 2008, the disclosure of which is incorporated herein by reference in its entirety.

BACKGROUND

1. Technical Field

The present invention relates to an electro-magnetic bandgap structure having a function of shielding in a specific frequency band.

2. Description of the Related Art

Recently, not only wire/wireless broadcasting and communication technologies but services related thereto are rapidly developing. As a unit of GHz is used as a clock frequency unit of a printed circuit board (PCB), Power Integrity (PI), Signal Integrity (SI) and Electro-Magnetic Interference (EMI), which are caused by various on-off chips such as a digital block loaded and located on a multi-layer PCB or Simultaneous Switching Noise (SSN) generated by an electronic device package, have become important issues in a PCB design.

One of the most general methods of solving the EMI problem and the PI/SI effect due to the Simultaneous Switching Noise (SSN) generated by a high-speed digital system is to connect a decoupling capacitor between a power layer and a ground layer. However, numerous decoupling capacitors are necessary for reducing the Simultaneous Switching Noise. As a result, PBC space occupation of the capacitors as well as production cost increase makes it difficult to freely dispose other various components. Moreover, numerous capacitors are not effective for reducing noise in a frequency band higher than 1 GHz, which is a problem in a recent high-speed digital system.

In order to find a new method of solving such a problem, i.e., the Simultaneous Switching Noise in 1 GHz band, research is now being devoted to an electro-magnetic bandgap (EBG) structure capable of selecting frequency.

Previously-studied electro-magnetic bandgap (EBG) structures generally include a Mushroom type (MT)-EBG and a Planar type (PT)-EBG.

The MT-EBG, for example, has a structure in which a plurality of mushroom shaped EBG cells (see reference numeral 130 of FIG. 1) are inserted between two conductive layers to function as both a power layer and a ground layer. The schematic structure of the MT-EBG is shown in FIG. 1. FIG. 1 shows only four EBG cells in all for the convenience of showing the drawing.

In FIG. 1, the MT-EBG 100 has a shape in which a conductive plate 131 is further formed between a first conductive layer 110 and a second conductive layer 120, and in which mushroom-shaped structures 130 connecting the first conductive layer 110 and the conductive plate 131 by means of a via 132 are repeatedly disposed. The first conductive layer 110 functions one of the power layer and the ground layer, and the second conductive layer 120 functions the other. Here, a first dielectric layer 115 is interposed between the first conductive layer 110 and the conductive plate 131. A second dielectric layer 125 is interposed between the conductive plate 131 and the second conductive layer 120.

A capacitance component, which is formed by the second conductive layer 120, the second dielectric layer 125 and the conductive plate 131, and an inductance component, which is formed by the via 132 which connects the conductive layer 110 with the conductive plate 131 by passing through the first dielectric layer 115, are L-C serially connected with each other between the first conductive layer 110 and the second conductive layer 120, so that such a MT-EBG 110 can performs a function as a kind of a band stop filter.

However, since at least three layers are required for implementing the MT-EBG 100, the structure has a maximum disadvantage in that the number of layers increases. Therefore, there occur problems of not only PCB manufacturing cost increase but Lead Time increase.

In the meantime, a PT-EBG has a structure in which a plurality of EBG cells (see reference numeral 220-1 of FIG. 2) having a specific pattern are repeatedly disposed over one whole conductive layer to function as a power layer or a ground layer. The schematic structure of the PT-EBG is shown in FIG. 2. FIG. 2 also shows only four EGB cells in all for the convenience of showing the drawing.

In FIG. 2, the PT-EBG 200 has a shape in which a plurality of conductive plates 221-1, 221-2, 221-3 and 221-4 located in a plane that is different from a plane on which any one conductive layer 210 is located are bridge-connected with each other through specific parts (the corner ends of conductive plates of FIG. 2) by use of branches 222-1, 222-2, 222-3 and 222-4 made of a conductive material.

In this case, the conductive plates 221-1, 221-2, 221-3 and 221-4 having wide areas form low impedance ranges. The conductive branches 222-1, 222-2, 222-3 and 222-4 having narrow areas form high impedance ranges. Accordingly, the PT-EBG performs a function as the band stop filter capable of shielding specific frequency band noise through a structure in which the low impedance range and the high impedance range are alternately repeated.

Unlike the MT-EBG structure, such a PT-EBG structure has an advantage in that an electro-magnetic bandgap structure can be implemented by means of only two layers. However, the PT-EBG structure has a problem that it is difficult to make the cell smaller because the PT-EBG structure forms the EBG structure by use of only two impedance components without various factors.

SUMMARY

The present invention provides an electro-magnetic bandgap structure capable of solving an EMI problem due to switching noise. Since a specific structure having patterns is repeatedly disposed in a printed circuit board, the electro-magnetic bandgap structure can shield switching noise in a specific frequency band and can be manufactured without increase of the number of layers and increase of area and volume. As a result, a small electronic apparatus such as a mobile phone, etc., can be appropriately applied to the electro-magnetic bandgap structure.

An aspect of the present invention features an electro-magnetic bandgap structure. The electro-magnetic bandgap structure in accordance with an embodiment of the present invention can include a plurality of conductive plates bridge-connected with one another on a same plane, whereas the each of the conductive plates includes an internal patch; a first ring patch be electrically separated from the internal patch and surrounding the internal patch; and a second ring patch surrounding the first ring patch and electrically connected with the first ring patch through a portion.

A conductive layer can be adjacently located in an upper part or a lower part of an area in which the plurality of conductive plates are disposed, whereas a dielectric layer can be interposed between the plurality of conductive plates and the adjacently located conductive layer.

The electro-magnetic bandgap structure can further include at least one via penetrating through the dielectric layer, one end of the via being electrically connected with the internal patch, the other end of the via being electrically connected with the adjacently located conductive layer.

The internal patch can have a shape obtained by reducing an outline shape of the conductive plate without modifying the outline shape and can be located at the center of the conductive plate.

The first ring patch and the second ring patch can have a respective outline shape obtained by sequentially enlarging an outline shape of the internal patch.

The outline shape of the conductive plate can be a rectangle.

An air gap can be formed between the internal patch and the first ring patch and between the second ring patch and the first ring patch excluding a connecting portion.

The portion through which the first ring patch is electrically connected with the second ring patch can be an end of one of outer corners of the first ring patch.

All of the plurality of conductive plates can be electrically connected with one another by bridge-connecting one conductive plate with another conductive plate adjacent to the conductive plate through an end of a corner. The plurality of conductive plates can have a same shape and area and can be two-dimensionally disposed on the same plane.

DETAILED DESCRIPTION

Hereinafter, an electro-magnetic bandgap structure according to the embodiment of the present invention will be described in detail with reference to accompanying drawings. Throughout the description of the present invention, the detailed description of known technologies incorporated herein will be omitted when it may make the subject matter of the present invention unclear. Numbers used for description of the present invention (for example, the first and the second, etc) are merely identification symbols for sequentially distinguishing the same or similar entities.

Figure 1:
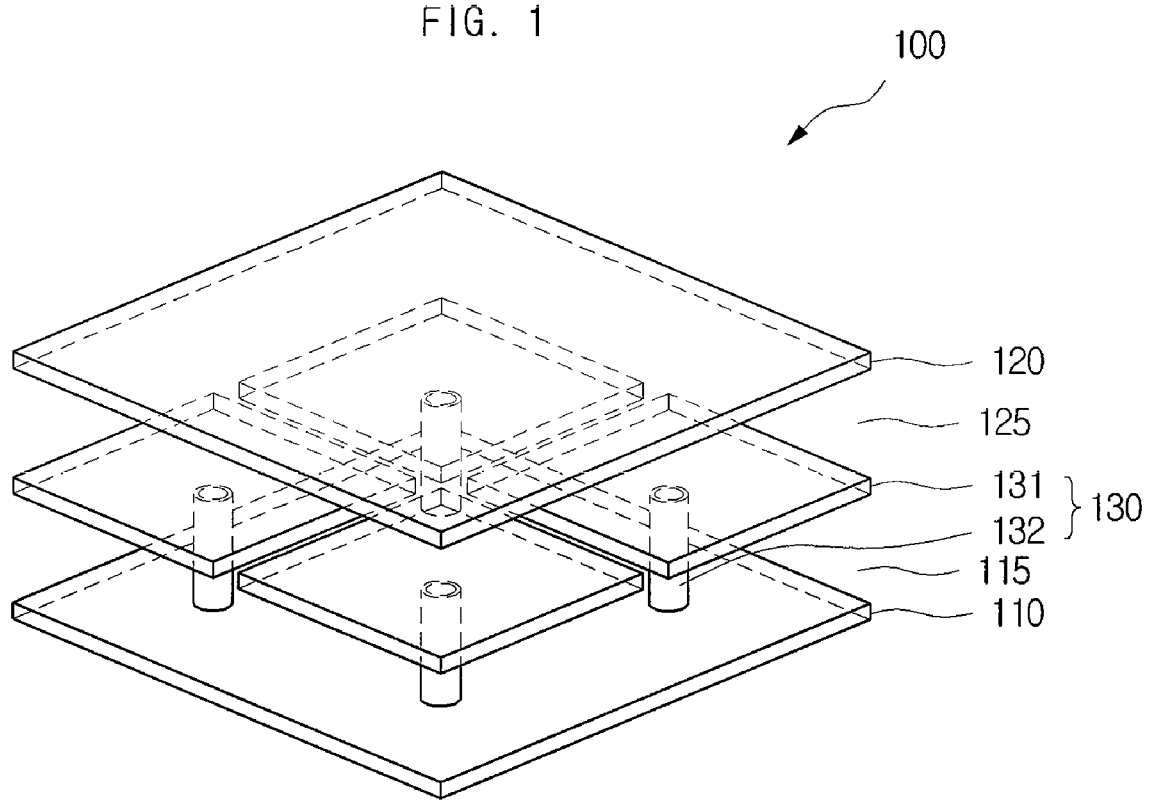
FIG. 1 is a view schematically showing a mushroom type (MT) EBG structure as an electro-magnetic bandgap structure according to a conventional technology.
Figure 2:
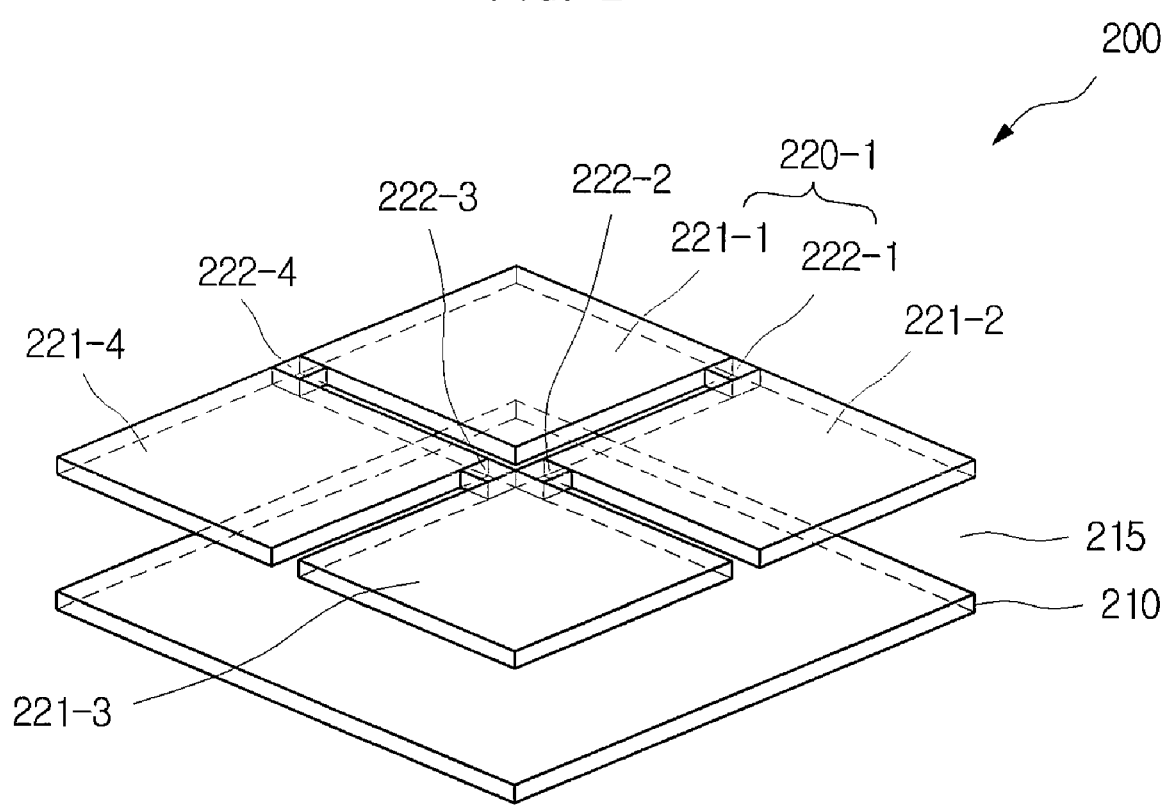
FIG. 2 is a view schematically showing a planar type (PT) EBG structure as another example of an electro-magnetic bandgap structure according to a conventional technology.
Figure 3:
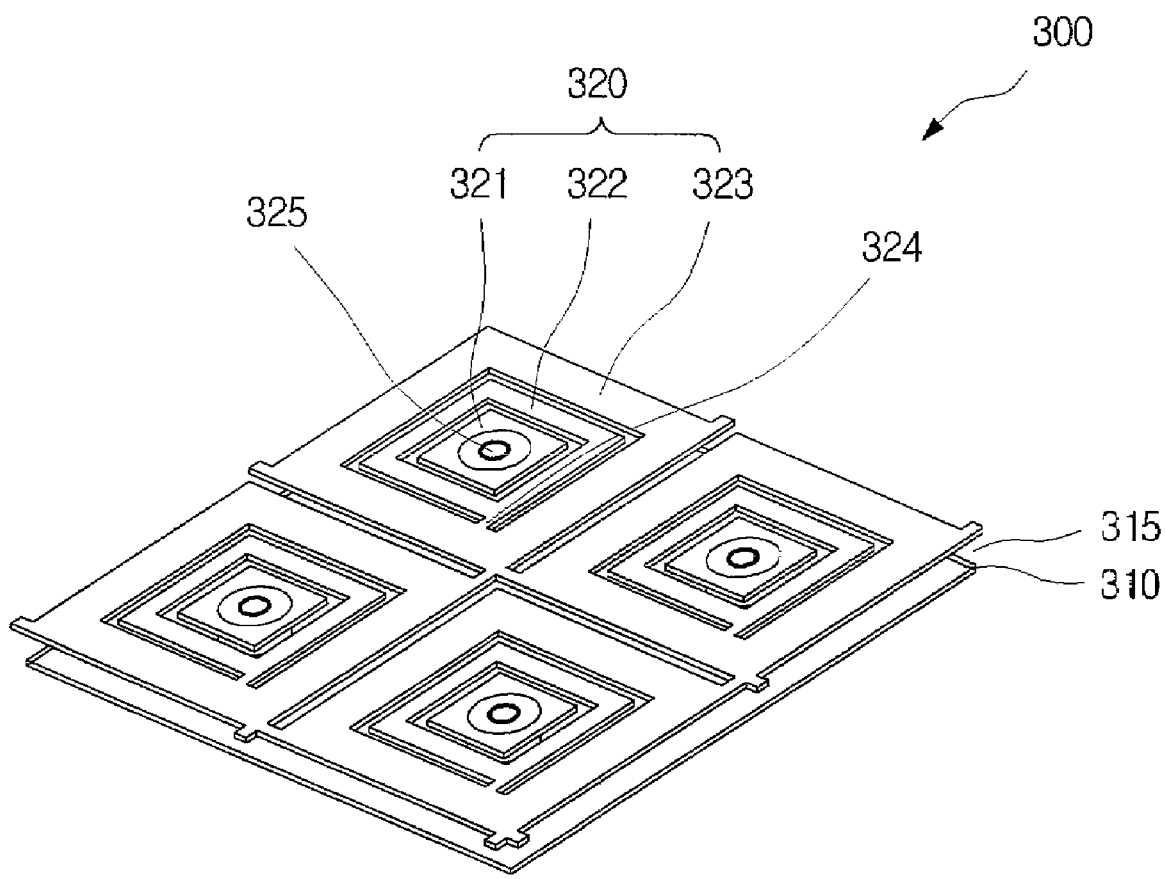
FIG. 3 shows an electro-magnetic bandgap structure, viewed from the top, according to an embodiment of the present invention.
Figure 4:
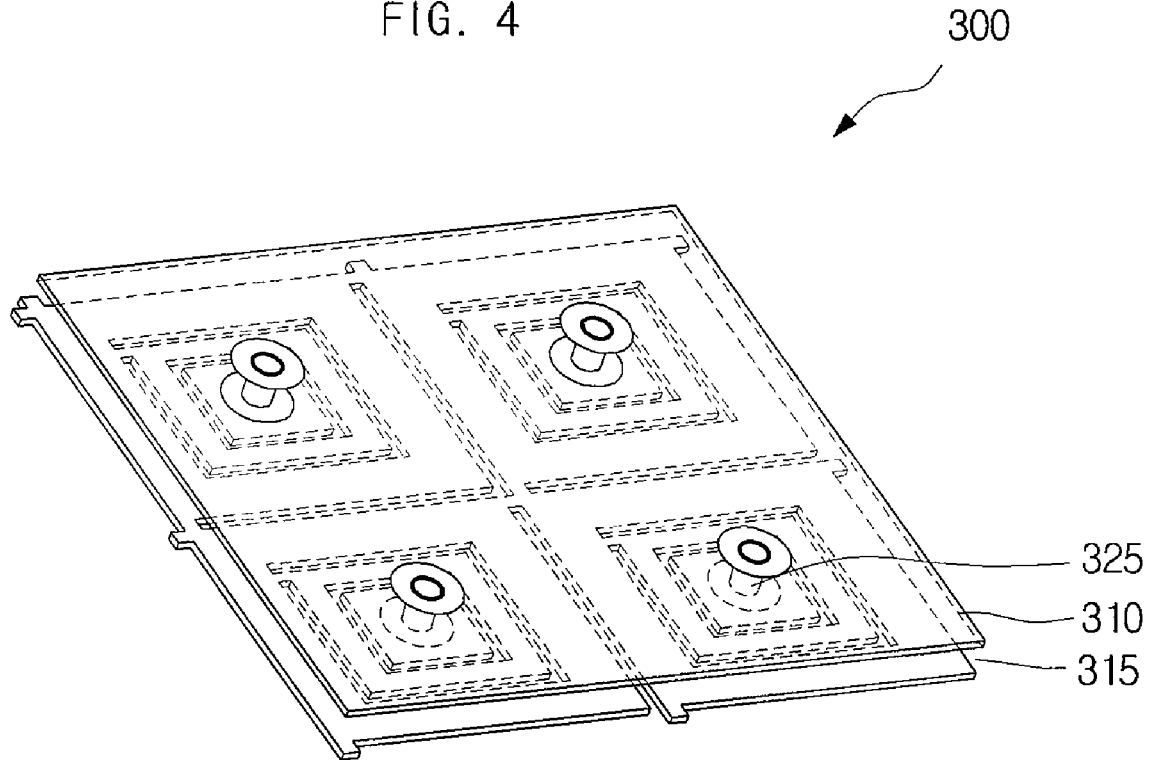
FIG. 4 shows an electro-magnetic bandgap structure of FIG. 3, viewed from the bottom.

FIG. 3 is a view showing an electro-magnetic bandgap structure according to the embodiment of the present invention as viewed from the top thereof. FIG. 4 is a view showing an electro-magnetic bandgap structure of FIG. 3 as viewed from the bottom thereof. Hereinafter, the features owned by the electro-magnetic bandgap structure of the present invention will be described with reference to FIGS. 3 and 4.

The electro-magnetic bandgap structure of the present invention includes a plurality of conductive plates which are bridge-connected with one another a same plane.

For example, in FIG. 3, shown is an example in which four conductive plates 320 having a same shape (that is, a rectangular shape) and an equal area are arranged on a same plane in the form of a 2×2 matrix. In this case, the four conductive plates electrically form one layer in the manner in which one conductive plate is bridge-interconnected with another conductive plate adjacent to the conductive plate, through the end of one corner.

Here, the shape of conductive plate can be a polygon, such as a rectangle, a hexagon, a triangle and the like, with varying areas. It is not necessarily to bridge-connect any two conductive plates only through the corner end. So long as the plurality of the conductive plates can form one electrical signal layer, various connecting methods can be also applied. Much more number of conductive plates can be two-dimensionally disposed in the entire area of any one layer or a necessary part of the layer.

The electro-magnetic bandgap structure of the present invention also includes one conductive layer that is located adjacently to the upper part or to the lower part of the area in which the plurality of the conductive plates are disposed. A dielectric layer is interposed between the plurality of the conductive plates and the conductive layer located adjacently to the plurality of the conductive plates.

FIGS. 3 and 4 show an example of the matter described above. In other words, a conductive layer 310 is located at a position adjacent to the upper part of the area in which four conductive plates are disposed in the form of a 2×2 matrix, and a dielectric layer 315 is interposed between the four conductive plates and the conductive layer 310.

Until now, the electro-magnetic bandgap structure has the same structure as that of the aforementioned Planar type-EBG (PT-EBG) according to the conventional technology. That is, the present invention provides a method and structure not only of adopting the advantage of the PT-EBG (i.e., being implementable by means of only two layers without increasing the number of the layers) as it is, but also of making an EBG cell smaller by reducing the size of the EBG cell.

To this end, the present invention uses a method of implementing an internal patch, a first ring patch and a second ring patch, which have a specific pattern, in each conductive plate functioning as one EGB cell, and of connecting the internal patch with at least one via. Hereinafter, inherently unique features of the present invention will be described focusing on the embodiments of FIGS. 3 and 4.

In addition, for the convenience of both description and comparison description with the MT-EBG and the PT-EBG according to the conventional technology, an electro-magnetic structure according to the present invention is abbreviated as a Ring type EBG (RT-EBG). Since EBG cells of an RT-EBG in accordance with the embodiments shown in FIGS. 3 and 4 are disposed repeatedly and densely with the same shape, area and pattern, the following description will be focused on one of the EBG cells (that is, one conductive plate).

In FIGS. 3 and 4, each of the EBG cells of an RT-EBG 300 according to the embodiment of the present invention includes an internal patch 321, a first ring patch 322 surrounding the internal patch 321 electrically separated therefrom, and a second ring patch 323 surrounding the first ring 322 electrically connected therewith through a portion 324.

The internal patch 321 has a shape obtained by reducing the outline shape (a rectangular shape in this case) of the conductive plate 320 without modifying the outline shape (that is, proportionally), and is located at the center of the entire conductive plate 320.

The internal patch 321 can also have a shape different from that of the conductive plate 320. So long as the internal patch 321 is located within the conductive plate 320, the internal patch 321 can be also located at any position other than the center of the conductive plate 320. In order to obtain longer pattern lengths of the first ring patch 322 and the second ring patch 323, the internal patch 321 has the same shape as that of the conductive plate 320 and is located at the center of the conductive plate 320.

The first ring patch 322 and the second ring patch 323 can have hereby outline shapes obtained by sequentially enlarging the outline shape of the internal patch 321, respectively. In other words, in FIG. 3, as the conductive plate 320 has a rectangular outline shape, the internal patch 321 has also the reduced rectangular outline shape, and the first ring patch 322 and the second ring patch 323 have also rectangular outline shapes having circumferences longer than that of the internal patch 321, respectively.

In each EBG cell of the RT-EBG of the present invention, the first ring patch 322 is electrically connected with the second ring patch 323 through the portion (the end 324 of a corner forming the outer outline of the first ring patch 322 in FIG. 3). The internal patch 321 is electrically separated from the first ring patch 322 and the second ring patch 323.

Therefore, in one EBG cell, the first ring patch 322 and the second ring patch 323 form one layer in regard to electrical signals. The internal patch 321 forms a layer different from the layer formed by first ring patch 322 and the second ring patch 323 in regard to electrical signals.

Here, the internal patch 321 can be electrically connected with a conductive layer located at a plane different from the plane on which the conductive plate is located, through at least one via. It can be understood that the internal patch 321 forms the same layer as the conductive layer 310 in regard to electrical signals by means of the via 325 which passes through the dielectric layer 315 and has one and the other ends thereof respectively connected with the internal patch 321 and the conductive layer 310 located adjacently to the conductive plates.

As described above, each of the two layers, which can be distinguished with regard to electrical signals, can function as, for example, the power layer and the ground layer, respectively. In this case, either switching noise or conduction noise between the power layer and the ground layer can be shielded by each of the EBG cells constituting the RT-EBG of the present invention.

Hereinafter, a principle of noise shielding (that is, shielding in a specific frequency band) by the RT-EBG of the present invention will be described below.

As described above, since the RT-EBG of the present invention basically includes the PT-EBG structure, the RT-EBG has an impedance component having two different values based on the PT-EBG structure, that is, thereby retaining a function as a basic band stop filter.

In addition, the RT-EBG of the present invention can additionally obtain inductance components as much as the lengths of the first ring patch 322 and the second ring patch 323, and can additionally obtain an inductance component caused by the via 325 connecting the internal patch 321 with the conductive layer 310. Besides, The RT-EBG of the present invention obtains the effect of increase of a capacitance component as well as the effect of increase of the inductance component.

In the RT-EBG of the present invention, an air gap is formed by etching both between the internal patch 321 and the first ring patch 322 and between the second ring patch 323 and the first ring patch 322 excluding the connecting portion. This causes the capacitance component to increase by the same effect as an effect in which a dielectric material is interposed between the two conductive materials.

As such, as the RT-EBG of the present invention can use both the inductance component and the capacitance component which are additionally obtainable, including the effect of the noise shielding caused by the two impedance components owned by the PT-EBG, a stop band of lower frequency band is formed as compared with the EBG cell having the same size.

Figure 5:
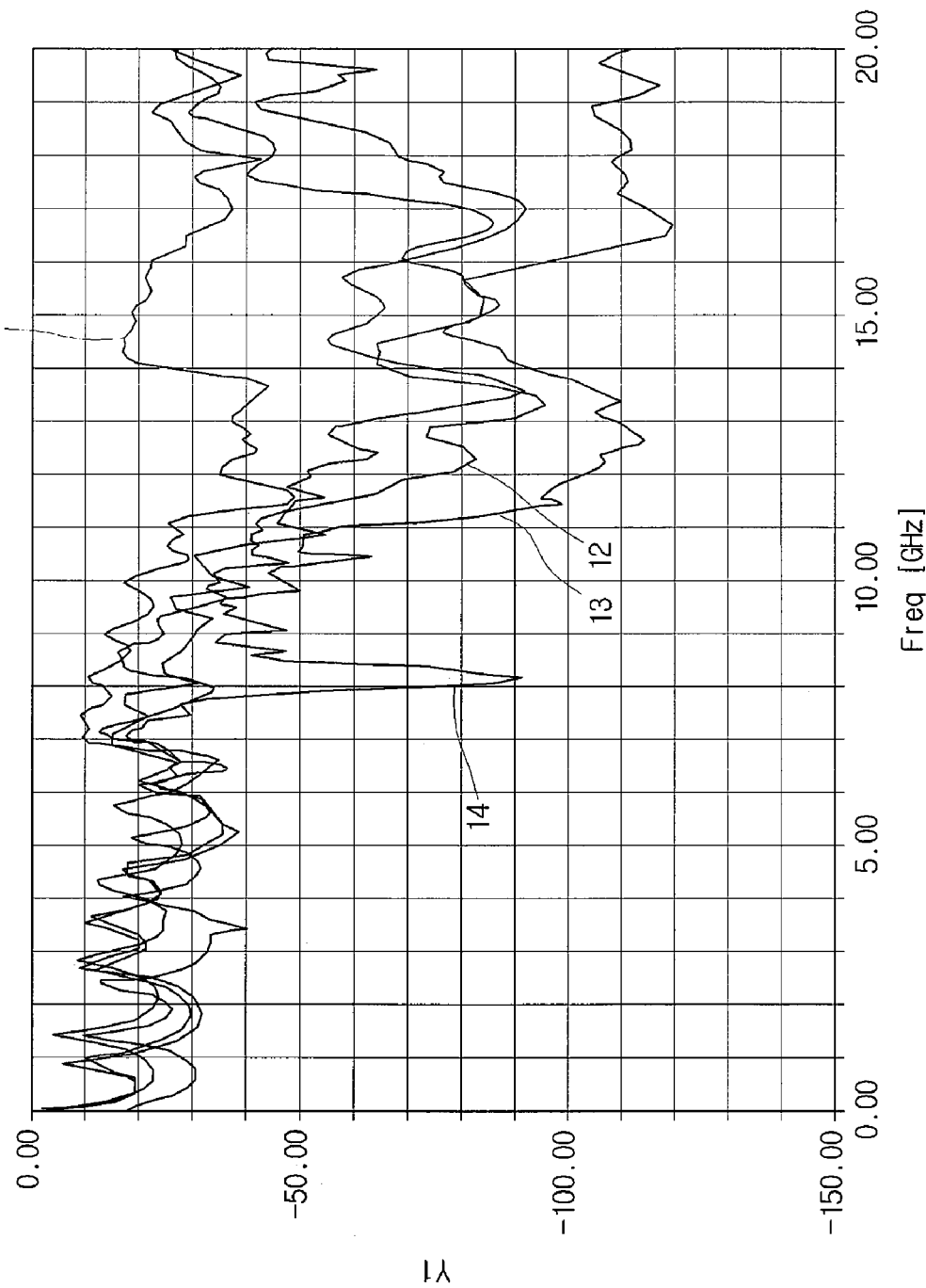
FIG. 5 is a view showing a simulation result including a frequency band characteristic in an electro-magnetic structure according to the embodiment of the present invention.

This is definitely cleared through a simulation result of FIG. 5. In FIG. 5, a frequency characteristic graph denoted by a reference numeral "11" shows that the EBG structure is not adopted in the PCB. A frequency characteristic graph denoted by a reference numeral "12" shows that the PT-EBG structure according to the conventional technology is adopted in the PCB. A frequency characteristic graph denoted by a reference numeral "13" shows that the MT-EBG structure according to the conventional technology is adopted in the PCB. A frequency characteristic graph denoted by a reference numeral "14" shows that the RT-EBG structure according to the present invention is adopted in the PCB. The EBG cells of all the EBG structures above have the same size.

According to the simulation result of FIG. 5, based on the EBG cells having the same size, it can be found that the stop band of the RT-EBG of the present invention is formed around 8 GHz on the basis of the shielding rate of −50 dB as compared with the fact that the stop bands of the MT-EBG and PT-EBG approximately exceed 10 GHz on the basis of the shielding rate of −50 dB.

As described above, the newly proposed RT-EBG improves the disadvantage of the existing MT-EBG and the PT-EBG. From the viewpoint of a structure, the EBG characteristic is implemented without increasing the layer by additionally forming the capacitance component through use of the air gap. With regard to the problem of being difficult to make the EBG cell smaller, i.e., the disadvantage of the PT-EBG, the RT-EBG structure according to the present invention is configured to be able to control the band gap through the via and the air gap inserted into a unit cell. It can be noted that it is possible to make the EBG cell smaller by means of increase of such capacitance component and increase of such inductance component. Actually, since the EBG cell should be smaller in advance in order to apply the EBG structure to an electronic apparatus such as a mobile phone and so on, the RT-EBG structure according to the present invention has a superb advantage in that it is possible to make the EBG cell smaller without increase of the number of layers.

While the present invention has been described with reference to exemplary embodiments thereof, it will be easily understood by those skilled in the art that various changes and modification in forms and details may be made without departing from the spirit and scope of the present invention as defined by the appended claims.

What is claimed is:

1. An electro-magnetic bandgap structure comprising a plurality of conductive plates bridge-connected with one another on a same plane, whereas each of the conductive plates comprises:
an internal patch;
a first ring patch configured to be electrically separated from the internal patch and to surround the internal patch; and a second ring patch configured to surround the first ring patch and to be electrically connected with the first ring patch through a portion.

2. The electro-magnetic bandgap structure of claim 1, wherein an air gap is formed between the internal patch and the first ring patch and between the second ring patch and the first ring patch excluding a connecting portion.

3. The electro-magnetic bandgap structure of claim 1, wherein the portion through which the first ring patch is electrically connected with the second ring patch is an end of one of outer corners of the first ring patch.

4. The electro-magnetic bandgap structure of claim 1, wherein all of the plurality of conductive plates are electrically connected with one another by bridge-connecting one conductive plate with another conductive plate adjacent to the conductive plate through an end of a corner.

5. The electro-magnetic bandgap structure of claim 1, wherein the plurality of conductive plates have a same shape and area and are two-dimensionally disposed on the same plane.

6. The electro-magnetic bandgap structure of claim 1, wherein a conductive layer is adjacently located in an upper part or a lower part of an area in which the plurality of conductive plates are disposed, whereas a dielectric layer is interposed between the plurality of conductive plates and the adjacently located conductive layer.

7. The electro-magnetic bandgap structure of claim 6, further comprising at least one via configured to penetrate through the dielectric layer, one end of the via being electrically connected with the internal patch, the other end of the via being electrically connected with the adjacently located conductive layer.

8. The electro-magnetic bandgap structure of claim 1, wherein the internal patch has a shape obtained by reducing an outline shape of the conductive plate without modifying the outline shape and is located at the center of the conductive plate.

9. The electro-magnetic bandgap structure of claim 8, wherein the first ring patch and the second ring patch have a respective outline shape obtained by sequentially enlarging an outline shape of the internal patch.

10. The electro-magnetic bandgap structure of claim 8, wherein the outline shape of the conductive plate is a rectangle.

* * * * *